US006350838B2

(12) United States Patent
Ma et al.

(10) Patent No.: US 6,350,838 B2
(45) Date of Patent: Feb. 26, 2002

(54) PACKAGE ENCAPSULANT COMPOSITIONS FOR USE IN ELECTRONIC DEVICES

(75) Inventors: Bodan Ma, Weehawken; Quinn K. Tong, Belle Mead, both of NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/894,540

(22) Filed: Jun. 28, 2001

Related U.S. Application Data

(62) Division of application No. 09/336,246, filed on Jun. 18, 1999.
(60) Provisional application No. 60/091,493, filed on Jul. 2, 1998.

(51) Int. Cl.[7] .................................................. C08F 26/08
(52) U.S. Cl. ....................... 526/262; 526/258; 526/259; 526/264; 526/315; 526/306; 526/310; 526/312
(58) Field of Search ....................... 526/258, 259, 526/262, 264, 305, 306, 310, 312

(56) References Cited

U.S. PATENT DOCUMENTS

| | | | |
|---|---|---|---|
| 3,403,172 A | 9/1968 | Jordan et al. ............ 260/404.5 |
| 4,311,636 A | 1/1982 | Hahn et al. ............... 260/45.8 |
| 4,336,311 A | 6/1982 | Lucey ........................ 428/521 |
| 4,485,218 A | 11/1984 | Bell et al. ................... 525/257 |
| 4,533,975 A | 8/1985 | Bill ............................ 361/323 |
| 4,540,650 A | 9/1985 | Klug et al. ................. 430/281 |
| 4,613,637 A | 9/1986 | Landis et al. .............. 524/105 |
| 4,623,559 A | 11/1986 | Hudock ..................... 427/54.1 |
| 4,663,424 A | 5/1987 | Stix et al. .................. 528/182 |
| 4,720,445 A | 1/1988 | Brahim et al. ............. 430/192 |
| 4,826,995 A | 5/1989 | Alexander et al. ......... 548/521 |
| 4,876,358 A | 10/1989 | Alexander ................. 548/521 |
| 4,980,436 A | 12/1990 | Saito et al. ................ 526/261 |
| 4,999,136 A | 3/1991 | Su et al. .................... 252/512 |
| 5,017,406 A | 5/1991 | Lutz .......................... 427/54.1 |
| 5,137,936 A | 8/1992 | Akiguchi et al. .......... 522/170 |
| 5,258,426 A | 11/1993 | Uchida et al. ............. 523/435 |
| 5,272,377 A | 12/1993 | Shimozawa et al. ....... 257/787 |
| 5,314,950 A | 5/1994 | Singh et al. ................. 525/73 |
| 5,347,258 A | 9/1994 | Howard et al. ............ 338/333 |
| 5,426,008 A | 6/1995 | Hagiwara et al. ............ 430/18 |
| 5,532,296 A | 7/1996 | Recker et al. ............. 523/400 |
| 5,602,205 A | 2/1997 | Singh et al. ................ 525/282 |
| 5,627,222 A | 5/1997 | Recker et al. ............. 523/400 |
| 5,726,391 A | 3/1998 | Iyer et al. .................. 174/52.2 |
| 5,760,337 A | 6/1998 | Iyer et al. .................. 174/52.2 |
| 5,863,664 A | 1/1999 | McCormick et al. ...... 428/500 |

FOREIGN PATENT DOCUMENTS

| | | | |
|---|---|---|---|
| EP | 0 028 994 A2 | 5/1981 | ........ H01L/23/28 |
| EP | 0 051 165 | 5/1982 | ........ H01L/23/14 |
| EP | 0 357 110 | 3/1990 | ........ C09D/151/00 |
| EP | 0 475 655 A2 | 3/1992 | ........ C08K/9/10 |
| JP | 1-152174 | 12/1987 | ........ C09D/5/44 |
| JP | 4-146984 | 5/1992 | ........ C09J/133/08 |
| JP | 10168413 | 6/1998 | ........ C09J/9/02 |
| WO | WO 96/07691 | 3/1996 | ........ C08G/73/10 |
| WO | WO 97/18254 | 5/1997 | ........ C08G/73/12 |

OTHER PUBLICATIONS

Mark A. Smith et al., "Bismaleimide/Vinyl Ether Matrix Copolymers", Department of Chemistry and Center for Marcomolecular Science and Engineering, Univ. of Florida, Gainesville, FL (2 pgs.).

Carol K. Sauers, "The Dehydration of N–Arylmaleamic Acids with Acetic Anhydride", The Journal of Organic Chemistry, vol. 34, No. 8, Aug. 1969, pp. 2275–2279.

Robert J. Cotter et al., "The Synthesis of N–Substituted Isomaleimides", vol. 26, Jan. 1961, pp. 10–15.

*Primary Examiner*—Helen L. Pezzuto
(74) *Attorney, Agent, or Firm*—Jane E. Gennaro

(57) ABSTRACT

A curable composition for encapsulating an electronic component comprises one or more mono- or polyfunctional maleimide compounds, or one or more mono- or polyfunctional vinyl compounds other than maleimide compounds, or a combination of maleimide and vinyl compounds, with a free radical curing agent, and optionally, one or more fillers.

27 Claims, No Drawings

PACKAGE ENCAPSULANT COMPOSITIONS FOR USE IN ELECTRONIC DEVICES

The priority of U.S. provisional application No. 60/091,493 filing date Jul. 2, 1998 is claimed under 35 USC 119(e). This application is a divisional of U.S. patent Ser. No. 09/336,246 filing date Jun. 18, 1999 allowed.

FIELD OF THE INVENTION

This invention relates to package encapsulant compositions for electronic devices that protect the electronic component and its metallization from environmental corrosion and mechanical damage.

BACKGROUND OF THE INVENTION

Microelectronic devices contain millions of electrical circuit components, mainly transistors assembled in integrated circuit (IC) chips, but also resistors, capacitors, and other components. The integrated circuit component may comprise a single bare chip, a single encapsulated chip, or an encapsulated package of single or multi-chips. These electronic components are interconnected to form the circuits, and eventually are connected to and supported on a carrier or substrate, such as a printed wire board.

The various materials used to manufacture the integrated circuits and their related interconnect materials are susceptible to environmental, moisture, and mechanical damage. Protection is provided by encapsulation of the electronic component within a polymeric material. Encapsulation can be performed by a transfer molding process in which the component is loaded into a mold cavity, constrained, and the polymeric encapsulant transferred from a reservoir into the cavity under pressure. Typically, the encapsulant is a thermosetting polymer, which then cross-links and cures to form the final assembly. Encapsulation also can be performed by dispensing an aliquot of polymeric encapsulant onto the component, such as a chip or integrated circuit supported on a substrate, and subsequently curing the composition.

For most commercial and industrial end uses, particularly those utilizing chip-on-board packages and multi-chip modules, the encapsulation is accomplished with polymeric thermosetting materials. The preferred thermosetting package encapsulation materials must have a viscosity and a thixotropic index that allows easy dispensability by syringe, sufficient adhesion to the components, low ionic content to avoid corrosion of the metallization, adequate mechanical strength, high thermal and moisture resistance at application temperatures, and matched coefficient of thermal expansion to the materials it contacts.

For single chip packaging involving high volume commodity products, a failed chip can be discarded without significant loss. However, it becomes expensive to discard multi-chip packages with only one failed chip, and the ability to rework the failed component would be a manufacturing advantage. Today, one of the primary thrusts within the semiconductor industry is to develop not only a package encapsulant that will meet all the requirements for protection of the component, but also a package encapsulant that will be reworkable, allowing for the failed component to be removed without destroying the substrate.

In order to achieve the required mechanical performance and reworkability, relatively high molecular weight thermoplastics would be the preferred compositions for package materials. These materials, however, have high viscosity or even solid film form, which are drawbacks to the manufacturing process. Therefore, there is a need for new encapsulant compositions that are easily dispensable to conform with automated manufacturing processes, and that are reworkable.

SUMMARY OF THE INVENTION

This invention is a curable encapsulant composition for electronic components that comprises one or more compounds containing one or more maleimide functionality, or one or more compounds containing one or more vinyl functionality, or a combination of compounds containing maleimide or vinyl functionality, a free-radical initiator and/or a photoinitiator, and optionally one or more fillers.

A compound containing one maleimide functionality will be referred to hereinafter as a mono-functional maleimide compound. A compound containing more than one maleimide functionality will be referred to hereinafter as a poly-functional maleimide compound. A compound containing one vinyl functionality will be referred to hereinafter as a mono-functional vinyl compound. A compound containing more than one vinyl functionality will be referred to hereinafter as a poly-functional vinyl compound. The functionality is defined herein to be a carbon to carbon double bond.

In another embodiment, this invention is also a cured encapsulant composition that results after the curing of the just described curable encapsulant composition.

In another embodiment, this invention is an electronic component electrically and mechanically connected to a substrate, encapsulated in a cured encapsulant composition, in which the cured encapsulant was prepared from a composition comprising one or more mono- or polyfunctional maleimide compounds, or one or more mono- or polyfunctional vinyl compounds other than maleimide compounds, or a combination of maleimide and vinyl compounds, a free radical curing agent and/or a photoinitiator, and optionally one or more fillers.

DETAILED DESCRIPTION OF THE INVENTION

The maleimide and vinyl compounds used in the package encapsulant compositions of this invention are curable compounds, meaning that they are capable of polymerization, with or without crosslinking. As used in this specification, to cure will mean to polymerize, with or without crosslinking. Cross-linking, as is understood in the art, is the attachment of two polymer chains by bridges of an element, a molecular group, or a compound, and in general will take place upon heating. As cross-linking density is increased, the properties of a material can be changed from thermoplastic to thermosetting, which consequently increases polymeric strength, heat-and electrical resistance, and resistance to solvents and other chemicals.

It is possible to prepare polymers of a wide range of cross-link density, from tacky, elastomeric to tough glassy polymers, by the judicious choice and amount of mono- or polyfunctional compounds. The greater proportion of polyfunctional compounds reacted, the greater the cross-link density.

If thermoplastic properties are desired, the package encapsulants of this invention can be prepared from mono-functional compounds to limit the cross-link density. However, a minor amount of poly-functional compounds can be added to provide some cross-linking and strength to the composition, provided the amount of poly-functional compounds is limited to an amount that does not diminish the desired thermoplastic properties. Within these parameters, the strength and elasticity of individual package encapsulants can be tailored to a particular end-use application. The cross-link density can also be controlled to give a wide range of glass transition temperatures in the cured encapsulant to withstand subsequent processing and operation temperatures.

In those cases where it is necessary to rework the assembly, a thermoplastic composition should be chosen so that the electronic component can be pried off the substrate. Any residue package encapsulant can be heated until it softens and then be easily removed.

In the inventive package encapsulant compositions, the maleimide compounds and the vinyl compounds may be used independently, or in combination. The maleimide or vinyl compounds, or both, will be present in the curable package encapsulant compositions in an amount from 2 to 98 weight percent based on the organic components present (excluding any fillers).

The package encapsulant compositions will further comprise at least one free-radical initiator, which is defined to be a chemical species that decomposes to a molecular fragment having one or more unpaired electrons, highly reactive and usually short-lived, which is capable of initiating a chemical reaction by means of a chain mechanism. The free-radical initiator will be present in an amount of 0.1 to 10 percent, preferably 0.1 to 3.0 percent, by weight of the maleimide or vinyl compound, or a combination of both maleimide and vinyl compounds (excluding any filler). The free radical curing mechanism gives a fast cure and provides the composition with a long shelf life before cure. Preferred free-radical initiators include peroxides, such as butyl peroctoates and dicumyl peroxide, and azo compounds, such as 2,2'-azobis(2-methyl-propanenitrile) and 2,2'-azobis(2-methyl-butanenitrile).

Alternatively, the encapsulant compositions may contain a photoinitiator, such as is sold by Ciba Specialty Chemicals under the trademark Irgacure, in lieu of the free-radical initiator, and the curing process may then be initiated by UV radiation. The photoinitiator will be present in an amount of 0.1 to 10 percent, preferably 0.1 to 3.0 percent, by weight of the maleimide or vinyl compound, or a combination of both maleimide and vinyl compounds (excluding any filler). In some cases, both photoinitiation and free-radical initiation may be desirable. For example, the curing process can be started by UV irradiation, and in a later processing step, curing can be completed by the application of heat to accomplish a free-radical cure.

In general, these compositions will cure within a temperature range of 80° to 180° C., and curing will be effected within a length of time of 5 minutes to 4 hours. As will be understood, the time and temperature curing profile for each encapsulant composition will vary, and different compositions can be designed to provide the curing profile that will be suited to the particular industrial manufacturing process.

Ease of application, even when thermoplastic properties are desired for the package encapsulant, is achieved by using relatively low molecular weight reactive oligomers or pre-polymers and curing these in situ after application to the electronic assembly of component and substrate. Applying the materials in an uncured state gives high processibility, and the resultant cured thermoplastic encapsulant provides high mechanical performance.

For some packaging operations, inert inorganic fillers are used in the package encapsulant to adjust the coefficient of thermal expansion to more closely mirror that of the circuit interconnect, and to mechanically reinforce the interconnect. Examples of suitable thermally conductive fillers include silica, graphite, aluminum nitride, silicon carbide, boron nitride, diamond dust, and clays. The fillers will be present typically in an amount of 20–80 percent by weight of the total package encapsulant composition.

As used throughout this specification: the notation C(O) refers to a carbonyl group.

Maleimide Compounds

The maleimide compounds suitable for use in the package encapsulant compositions of this invention have a structure represented by the formula: [M—Ar $_m$]$_n$—Q, or by the formula: [M—Z $_m$]$_n$—Ar. For these specific formulae, when lower case "n" is the integer 1, the compound will be a mono-functional compound; and when lower case "n" is an integer 2 to 6, the compound will be a poly-functional compound.

Formula [M—Ar $_m$]$_n$—Q represents those compounds in which: M is a maleimide moiety having the structure

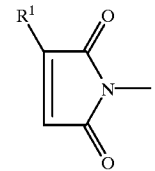

in which
R$^1$ is H or C$_1$ to C$_5$ alkyl;
each Ar independently is an aromatic group selected from the aromatic groups having the structures (I) through (V):

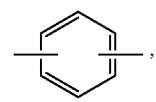
(I)

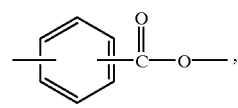
(II)

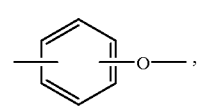
(III)

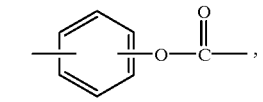
(IV)

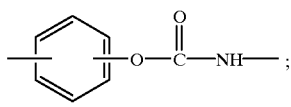
(V)

and Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to Ar;

or Q is a urethane having the structure:

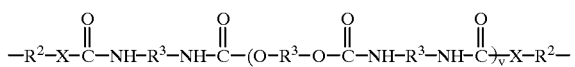

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Q is an ester having the structure:

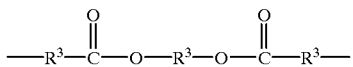

in which $R^3$ is an alkyl or alkyloxy chain having up to 100 atoms in the chain, which chain may contain aryl substituents;

or Q is a siloxane having the structure: $-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms and the $R^4$ substituent independently for each position is an alkyl group having 1 to 5 carbon atoms or an aryl group, and e and g are independently 1 to 10 and f is 1 to 50; and m is 0 or 1, and n is 1 to 6.

Preferably, Ar is structure (II), (III), (IV) or (V), and more preferably is structure (II).

Preferably, Q is a linear or branched chain alkyl, alkyloxy, alkylene, or alkyleneoxy species having up to about 100 atoms in the chain, as described with pendant saturated or unsaturated cyclic or heterocyclic substituents, or a siloxane as described, and more preferably is a linear or branched chain alkyl species or siloxane, as described.

Formula [M—$Z_m$]$_n$—Ar represents those compounds in which M is a maleimide moiety having the structure

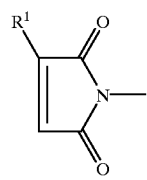

in which $R^1$ is H or $C_1$ to $C_5$ alkyl;

Z is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to K;

or Z is a urethane having the structure:

$-R^2-X-\overset{O}{\underset{\|}{C}}-NH-R^3-NH-\overset{O}{\underset{\|}{C}}-(O-R^3-O-\overset{O}{\underset{\|}{C}}-NH-R^3-NH-\overset{O}{\underset{\|}{C}})_{\!\!\nu}X-R^2-$ in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Z is an ester having the structure:

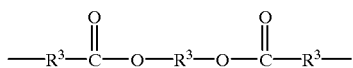

in which $R^3$ is an alkyl or alkyloxy chain having up to 100 atoms in the chain, which chain may contain aryl substituents;

or Z is a siloxane having the structure: $-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms and the $R^4$ substituent independently for each position is an alkyl group having 1 to 5 carbon atoms or an aryl group, and e and g are independently 1 to 10 and f is 1 to 50;

Ar is an aromatic group selected from the aromatic groups having the structures (VI) through (XIII) (although only one bond may be shown to represent connection to the aromatic group K, this will be deemed to represent any number of additional bonds as described and defined by n):

(VI)

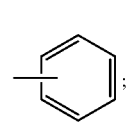

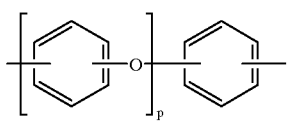

in which p is 1 to 100;

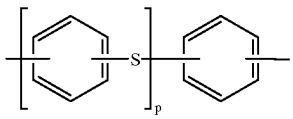

in which p is 1 to 100;

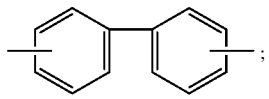

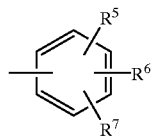

in which

R$^5$, R$^6$, and R$^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or R$^5$, R$^6$, and R$^7$ are a siloxane having the structure —(CR$^1_2$)$_e$—[SiR$^4_2$—O]$_f$—SiR$^4_2$—(CH$_3$)$_g$— in which the R$^1$ substituent is H or an alkyl group having 1 to 5 carbon atoms and the R$^4$ substituent independently for each position is an alkyl group having 1 to 5 carbon atoms or an aryl group, and e is 1 to 10 and f is 0 to 50;

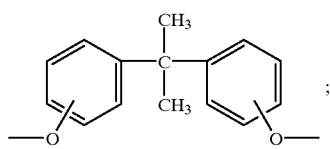

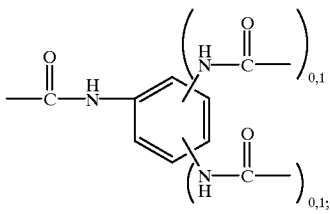

and

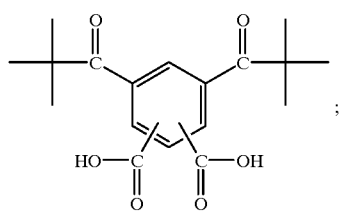

and m is 0 or 1, and n is 1 to 6.

Preferably, Z is a linear or branched chain alkyl, alkyloxy, alkylene, or alkyleneoxy species having up to about 100 atoms in the chain, as described with pendant saturated or unsaturated cyclic or heterocyclic substituents, or a siloxane as described, and more preferably is a linear or branched chain alkyl species or siloxane, as described.

Preferably, Ar is structure (VIII), (X) or (XI), more preferably is structure (X) or (XI), and most preferably is structure (X).

The more preferred maleimide compounds, particularly for use as reworkable encapsulants, are N-butylphenyl maleimide and N-ethylphenyl maleimide.

Vinyl Compounds

The vinyl compounds (other than the maleimides) herein will have the structure:

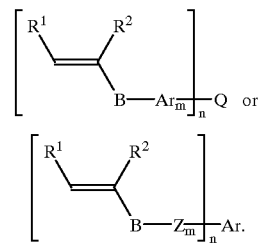

For these specific structures, when lower case "n" is the integer 1, the compound will be a mono-functional compound; and when lower case "n" is an integer 2 to 6, the compound will be a poly-functional compound.

In these structures, R$^1$ and R$^2$ are H or an alkyl having 1 to 5 carbon atoms, or together form a 5 to 9 membered ring with the carbons forming the vinyl group; B is C, S, N, O, C(O), O—C(O), C(O)—O, C(O)NH or C(O)N(R$^8$), in which R$^8$ is C$_1$ to C$_5$ alkyl; m is 0 or 1; n is 1–6; and Ar, Q, and Z are as described above.

Preferably, B is O, C(O), O—C(O), C(O)—O, C(O)NH or C(O)N(R$^8$); more preferably B is O, C(O), O—C(O), C(O)—O, or C(O)N(R$^8$).

Other Composition Components

Depending on the nature of the substrate to which the package encapsulant is to be bonded, the encapsulant may also contain a coupling agent. A coupling agent as used herein is a chemical species containing a polymerizable functional group for reaction with the maleimide and other vinyl compound, and a functional group capable of condensing with metal hydroxides present on the surface of the substrate. Such coupling agents and the preferred amounts for use in compositions for particular substrates are known in the art. Suitable coupling agents are silanes, silicate esters, metal acrylates or methacrylates, titanates, and compounds containing a chelating ligand, such as phosphine, mercaptan, and acetoacetate. When present, coupling agents typically will be in amounts up to 10 percent by weight, and preferably in amounts of 0.1–3.0 percent by weight, of the maleimide and other monofunctional vinyl compound.

In addition, the encapsulant compositions may contain compounds that lend additional flexibility and toughness to the resultant cured encapsulant. Such compounds may be any thermoset or thermoplastic material having a Tg of 50° C. or less, and typically will be a polymeric material characterized by free rotation about the chemical bonds, such as can be obtained by the presence of carbon-carbon double bonds adjacent to carbon-carbon single bonds, the presence of ester and ether groups, and the absence of ring structures. Suitable such modifiers include polyacrylates, poly(butadiene), polyTHF ( polymerized tetrahydrofuran), CTBN (carboxy-terminated butyronitrile) rubber, and polypropylene glycol. When present, toughening compounds may be in an amount up to about 15 percent by weight of the maleimide and other monofunctional vinyl compound.

If siloxane moieties are not part of the maleimide or vinyl compound structure, siloxanes can be added to the package encapsulant formulations to impart elastomeric properties. Suitable siloxanes are the methacryloxypropyl-terminated polydimethyl siloxanes, and the aminopropyl-terminated polydimethylsiloxanes, available from United Chemical Technologies.

Other additives, such as adhesion promoters, may also be added as needed. The kinds and amounts of adhesion promoters that may be used are known to those skilled in the art.

Another embodiment of this invention includes the maleimides having the formulae $[M-Ar_m]_n-Q$ and $[M-Z_m]_n-Ar$ as described herein in which Q and Z can be an ester having the structure

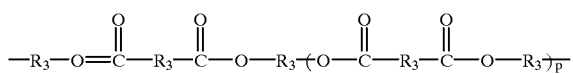

or the structure

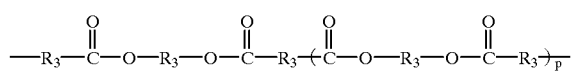

in which
p is 1 to 100,
each $R^3$ can independently be an alkyl or alkyloxy chain having up to 100 atoms in the chain, which chain may contain aryl substituents, or
a siloxane having the structure $-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10 and f is 1 to 50.

Another embodiment of this invention includes the vinyl compounds having the structures

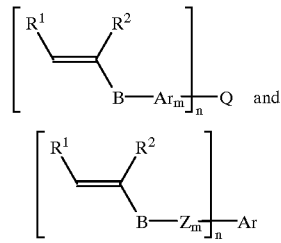

as described herein in which B is C, S, N, O, C(O), C(O)NH or C(O)N($R^8$), in which $R^8$ is $C_1$ to $C_5$ alkyl.

Another embodiment of this invention includes the vinyl compounds having the structures

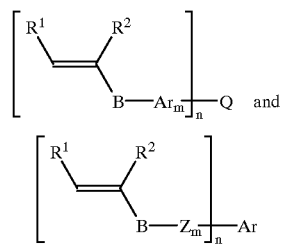

as described herein in which Q and Z can be an ester having the structure

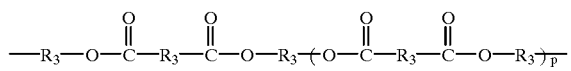

or the structure

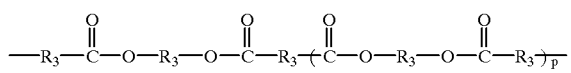

in which
p is 1 to 100,
each $R^3$ can independently be an alkyl or alkyloxy chain having up to 100 atoms in the chain, which chain may contain aryl substituents,
or a siloxane having the structure $-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50.

Another embodiment of this invention includes the composition as described herein containing an anionic or cat-ionic curing initiator. The types and useful amounts of such initiators are well known in the art.

EXAMPLES

Various maleimide and vinyl compounds were prepared and formulated into package encapsulant compositions. The compositions were investigated for viscosity and thixotropic index for the uncured composition, and for curing profile, glass transition temperature, coefficient of thermal expansion, thermal mechanical analysis, and reworkability for the cured composition.

Example 1

Preparation of Benzamido-endcapped Dimer Diamine Bismaleimide funnel was charged with p-nitrobenzoyl chloride (13.6 g, 73 mmol) in iethyl ether ($Et_2O$) (50 mL), and this solution was added to the reaction vessel over the course of 60 minutes, maintaining an internal T<10° C. The reaction was stirred at ~3° C. for an additional 60 minutes after this addition was complete, then allowed to warm to room temperature and stirred for another 4 hours. The solution was transferred to a separatory funnel and the isolated organic layer washed with distilled $H_2O$ (300 mL), 5% $HCl_{aq}$ (300 mL), $NaCl_{aq}$ (250 mL) and distilled $H_2O$ (2×250 mL). The organics were isolated, dried over $MgSO_4$ anhyd., filtered and the solvent removed in vacuo to yield the dinitro compound as a viscous yellow oil which exhibited acceptable $^1H$ NMR and IR spectra (30.0 g, 96%).

The dinitro compound described above (5.0 g, 5.9 mmol) was dissolved in methanol (MeOH) (25 mL) and THF (5

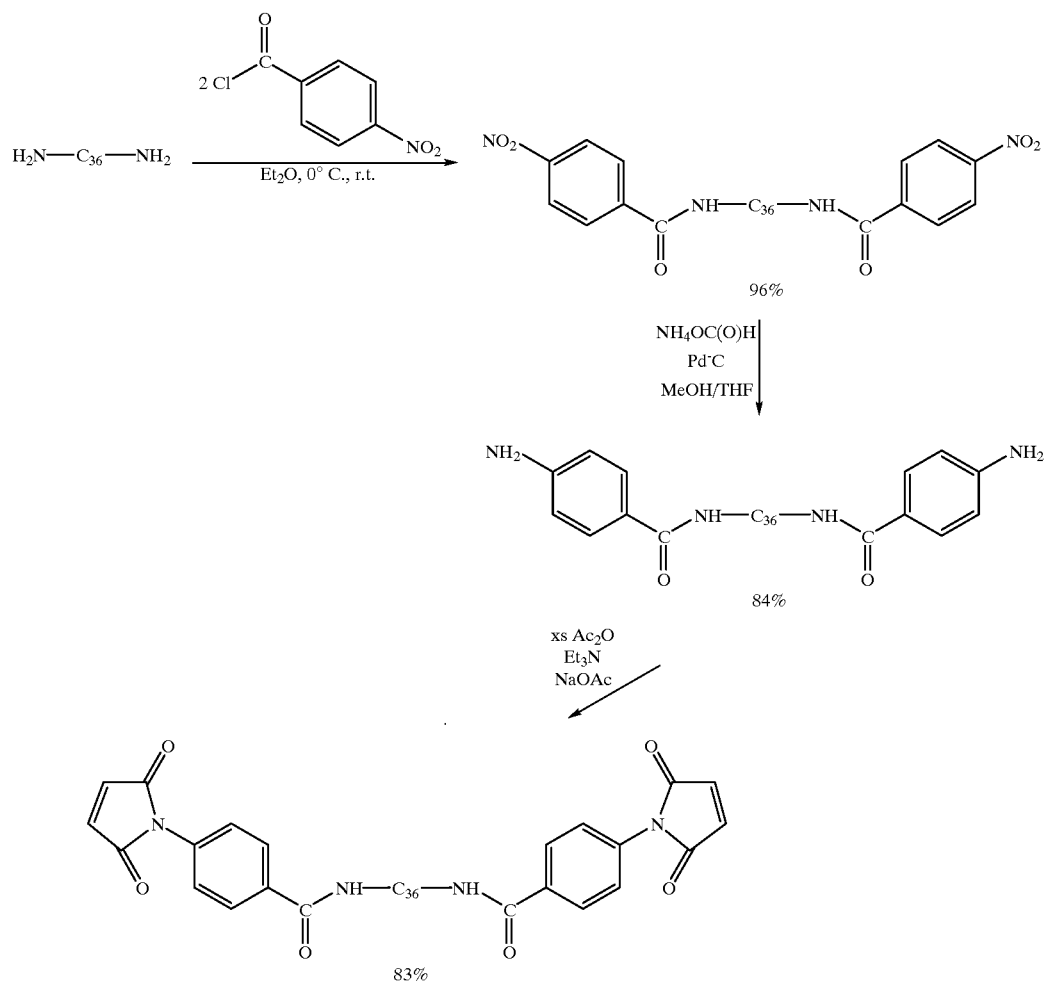

Dimer diamine (sold as Versamine 552 by Henkel, 20.0 g, 37 mmol) was solvated in $Et_2O$ (200 mL) in a 500 mL three-necked flask equipped with an addition funnel, magnetic stirring, internal temperature probe and nitrogen inlet/outlet. $NaOH_{aq}$ (11. 7 mL of 6.25 M solution diluted with 100 mL $H_2O$, 73 mmol) was added with vigorous stirring. This solution was placed under a steady flow of nitrogen and cooled to 3° C. on an ice bath with stirring. The addition mL) in a 250 mL three-necked flask equipped with magnetic stirring, reflux condensor and nitrogen inlet/outlet. The solution was placed under nitrogen, and 5% Pd-C (0.96 g) were added with stirring. Ammonium formate (3.4 g, 55 mmol) was added and the reaction stirred at room temperature for 2 hours. Carbon dioxide evolution was immediately observed. The reaction solution was filtered, and bulk filtrate solvent was removed via rotary evaporator. The resulting viscous oil was dissolved in diethyl ether (Et$_2$O) (150 mL), washed with distilled H$_2$O (150 mL), isolated and dried over MgSO$_4$ anhyd. Solvent was removed in vacuo to yield the diamine as a sticky tan oil, which exhibited acceptable $^1$H NMR and IR spectra (3.9 g, 84%).

Maleic anhydride (0.5 g, 5.1 mmol) was dissolved in acetone (10 mL) in a 250 mL three-necked flask equipped with magnetic stirring, addition funnel and nitrogen inlet/outlet. The solution was cooled on an ice bath and placed under nitrogen. The addition funnel was charged with an acetone (10 mL) solution of the diamine described above (2.0 g, 2.60 mmol), which was added dropwise over 30 minutes. The reaction was stirred for an additional 30 minutes on the ice bath, then allowed to warm to room temperature, and stirred for another 4 hours. To the resulting slurry was added acetic anhydride (Ac$_2$O) (1.54 mL, 160 mmol), triethyl amine (Et$_3$N) (0.23 mL, 1.63 mmol) and sodium acetate (NaOAc) (0.16 g, 1.9 mmol). The resulting slurry was heated to mild reflux for 5 hours. The reaction was allowed to cool to room temperature, and solvent removed via rotary evaporator to yield a brown oil. This material was dissolved in CH$_2$Cl$_2$ (250 mL) and washed with distilled H$_2$O (200 mL), satd. NaHCO$_3$ (200 mL) and distilled H$_2$O (200 mL). Emulsions were broken by adding NaCl when necessary. The organic layer was isolated, dried over MgSO$_4$ anhyd. and solvent removed in vacuo to yield the bismaleimide, a brown solid (2.0 g, 83%). The resin exhibited satisfactory $^1$H NMR, $^{13}$C NMR and IR spectra, which indicated slight contamination with acetic acid.

Example 2

Preparation of 20-Bismaleimido-10,11-dioctyl-eicosame (and isomers)

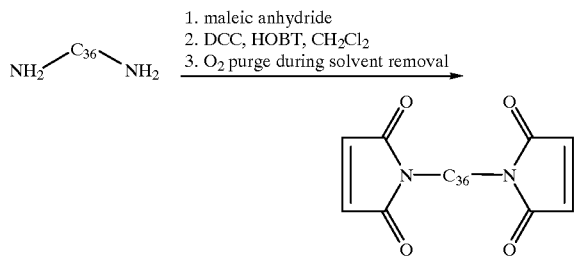

In a 5 L multi-neck flask equipped with a drying tube, thermometer, slow addition funnel, mechanical stirrer and nitrogen purge maleic anhydride (98.06 g, 1.02 equivalents on —NH$_2$) was dissolved in 500 ml tetrahydrofuran (THF). Stirring was begun and the solution was chilled with a dry ice/water bath. Slow addition of dimer diamine (Versamine 552, Henkel, 245.03 g, 0.4477 mol) in 250 ml THF was begun. Addition was carried out over 1 hour. After addition was complete the ice bath was removed and 375 ml of THF was rinsed through the slow addition funnel to incorporate solidified diamine. After one hour the ice bath was replaced around the flask. 1-Hydroxybenzotriazole (96.79 g, 0.80 equivalents on —NH$_2$) was added rinsing into the flask with 50 ml THF. When the temperature had reached 5° C. slow addition of dicyclohexylcarbodiimide (DCC) (188.43 g, 1.02 equivalents on —NH$_2$) in 200 ml THF was begun. The temperature during addition was kept below ten degrees. After DCC addition was complete the slow addition funnel was rinsed with 80 ml of THF. The ice bath was removed. The reaction was monitored by IR. When it appeared that the isoimide has been converted to maleimide (approximately 4 hours after the completion of DCC addition) the mixture was filtered, rinsing the solids with THF. The orange solution was placed in the freezer overnight.

The solution was removed from the freezer and allowed to warm to room temperature. Hydroquinone (0.0513 g) was added to the solution. A partial strip of the THF was carried out on a rotary evaporator with the temperature maintained below 28° C. The solution was concentrated to approximately 800 ml. Much particulate matter was visible. The solution was placed in freezer overnight.

The mixture was removed from the freezer and allowed to warm. The solids were filtered, rinsing with THF. The filtrate was transferred to a 2 L multi-neck flask equipped with a mechanical stirrer, vacuum line connected to a trap, and a glass tube attached by tubing to a drying tube. The remaining THF was stripped at room temperature by pulling a vacuum and bubbling air through the material while stirring. The resultant thick, creamy-tan colored semi-solid was placed in the freezer overnight.

The semi-solid was removed from the freezer and allowed to warm. The semi-solid was dissolved in 450 ml each of methanol and hexane, and washed with 50% methanol/water (4×250 ml) to remove 1-hydroxybenzotriazole (HOBT). It was attempted to extract the product with hexane. After addition of 300 ml of hexane separation was not observed. The mixture was washed with additional water (3×250 ml). The organic phase was placed in the freezer overnight.

The material was removed from the freezer. Two layers were apparent. The upper layer was clear and yellow in color. The bottom layer was a orange and cloudy. The material was poured cold into a separatory funnel. The top layer was hexane and the desired product. The bottom layer was extracted with hexane (6×200 ml), separation occurred easily. The combined extracts were dried over anhydrous magnesium sulfate and filtered, rinsing the solids with hexane. The solvent was stripped to an approximate volume of 750 ml on a rotary evaporator with the temperature not exceeding 24° C. The remaining solvent was stripped off using a vacuum/air bubbling set-up at room temperature to give the desired product in 67% yield.

Example 3

Preparation of Butadiene-Acrylonitrile Bismaleimide

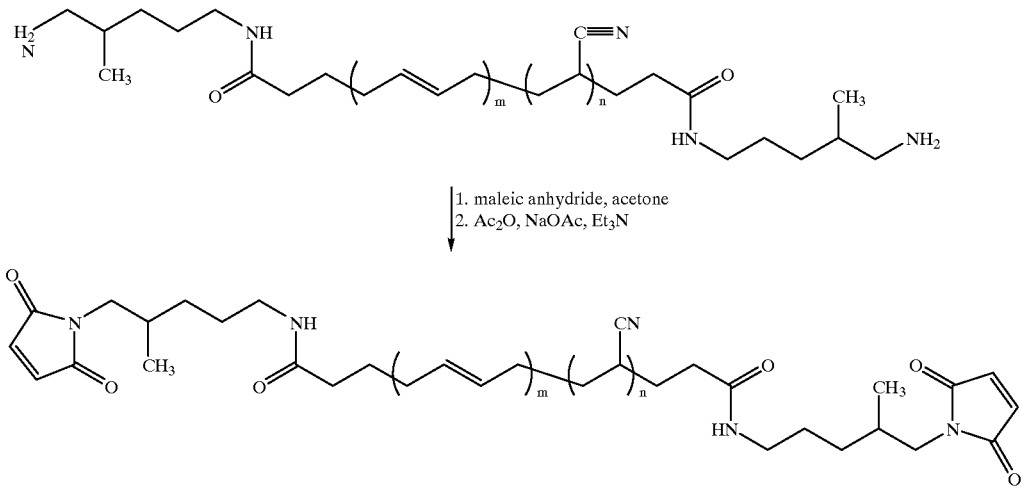

Amino-terminated butadiene-acrylonitrile (sold as Hycar resin 1300 X42 ATBN by BF Goodrich, in which the m and n depicted in the structure are integers to provide a number average molecular weight of 3600) (450 g, 500 mmol based on amine equivalent weight AEW=450 g) was dissolved in $CHCl_3$ (1000 mL) in a 3 L four-necked flask equipped with addition funnel, mechanical stirrer, internal temperature probe and nitrogen inlet/outlet. The stirred solution was placed under nitrogen and cooled on an ice bath. The addition funnel was charged with maleic anhydride (98.1 g, 1 mol) in $CHCl_3$ (50 mL) and this solution was added to the reaction over 30 minutes, maintaining the internal reaction temperature below 10° C. This mixture was stirred for 30 minutes on ice, then allowed to warm to room temperature and stirred for an additional 4 hours. To the resulting slurry was added acetic anhydride ($Ac_2O$) (653.4 g, 6 mol), triethyl amine ($Et_3N$) (64.8 g, 0.64 mol) and NaOAc (62.3 g, 0.76 mol). The reaction was heated to mild reflux for 5 hours, allowed to cool to room temperature, and subsequently extracted with $H_2O$(1 L), satd. $NaHCO_3$ (1 L) and $H_2O$ (2×1 L). Solvent was removed in vacuo to yield the maleimide terminated butadiene acrylonitrile.

Example 4

Preparation of Tris(maleimide) Derived From Tris (epoxypropyl)isocyanurate

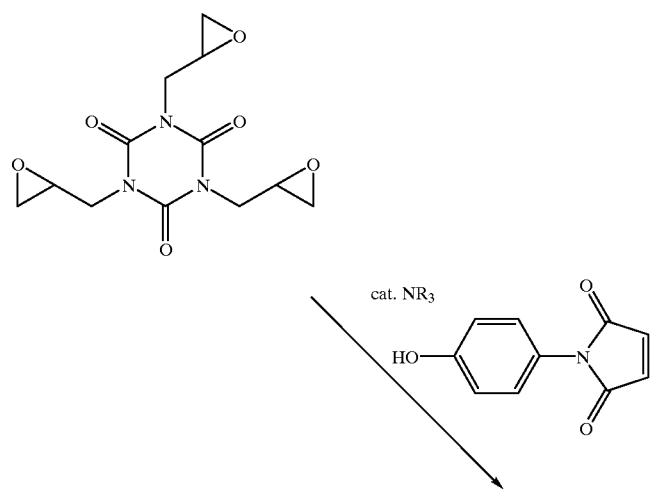

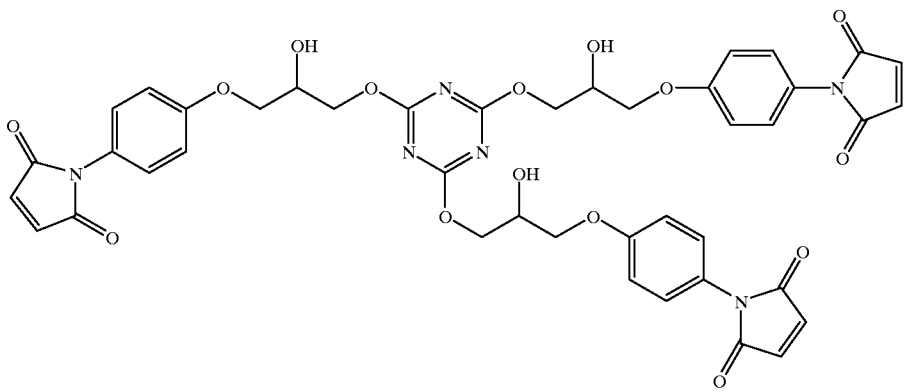

Tris(epoxypropyl)isocyanurate (99.0 g, 0.33 mol) is dissolved in THF (500 mL) in a 2 L three-necked flask equipped with mechanical stirrer, internal temperature probe and nitrogen inlet/oulet. To this solution is added hyroxyphenylmaleimide (189.2 g, 1 mol) and benzyldimethylamine (1.4 g, 0.05 wt. %). The solution is heated to 80° C. for 7 hours. The reaction is allowed to cool to room temperature, is filtered, and the filtrant washed with 5% $HCl_{aq}$ (500 mL) and distilled $H_2O$ (1 L). The resulting solid, triazinetris(maleimide), is vacuum dried at room temperature.

Example 5

Preparation of Maleimidoethylpalmitate

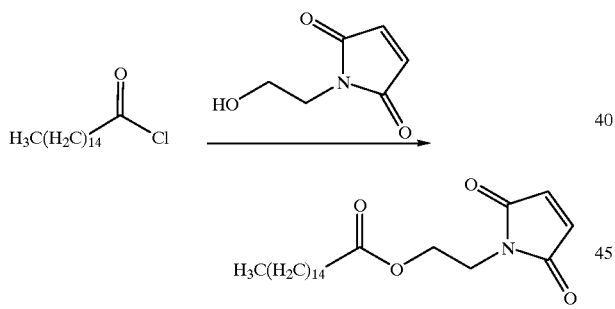

Palmitoyl chloride (274.9 g, 1 mol) is dissolved in $Et_2O$ (500 mL) in a 2 L three-necked flask equipped with mechanical stirrer, internal temperature probe, addition funnel and nitrogen inlet/outlet. $NaHCO_3$ (84.0 g, 1 mol) in distilled $H_2O$ (500 mL) is added with vigorous stirring and the solution cooled on an ice bath under nitrogen. The addition funnel is charged with hydroxyethylmaleimide (141 g, 1 mol) in $Et_2O$ (100 mL) and this solution added to the reaction over a period of 30 minutes, maintaining an internal T<10° C. during the addition. The reaction is stirred for another 30 minutes on ice, then allowed to warm to room temperature and stirred for 4 hours. The reaction is transferred to a separatory funnel and the isolated organic layer washed with distilled $H_2O$ (500 mL), 5% $HCl_{aq}$ (500 mL) and distilled $H_2O$ (2×500 mL). The organics are isolated, dried over $MgSO_4$ anhyd., filtered and solvent removed in vacuo to yield the aliphatic maleimide.

Example 6

Preparation of Bismaleimide Derived from 5-Isocyanato-1-(isocyanatomethyl)-1,3,3-trimethylcyclohexane

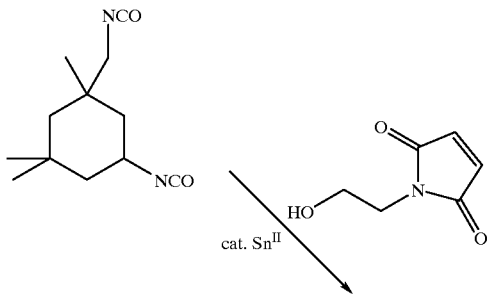

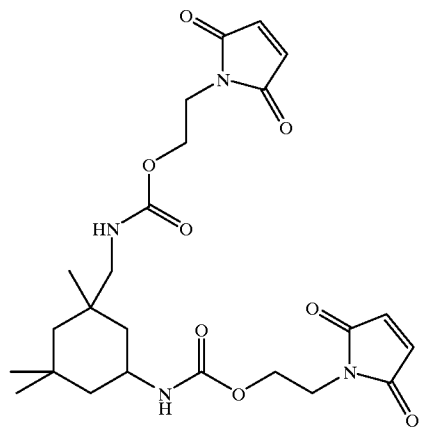

5-Isocyanato-1-(isocyanatomethyl)-1,3,3-trimethylcyclohexane (111.15 g, 0.5 mol) is solvated in THF (500 mL) in a 1 L three-necked flask equipped with mechanical stirrer, addition funnel and nitrogen inlet/outlet. The reaction is placed under nitrogen, and dibutyltin dilaurate (cat. $Sn^{II}$) (6.31 g, 10 mmol) and hydroxyethylmaleimide (141 g, 1 mol) are added with stirring, and the resulting mixture heated for 4 hours at 70° C. The addition funnel is charged with hydroxyethylmaleimide (141 g, 1 mol) dissolved in THF (100 mL). This solution is added to the isocyanate solution over 30 minutes, and the resulting mixture heated for an additional 4 hours at 70° C. The reaction is allowed to cool to room temperature and solvent removed in vacuo. The remaining oil is dissolved in $CH_2Cl_2$ (1 L) and washed with 10% $HCl_{aq}$ (1 L) and distilled $H_2O$ (2×1 L). The isolated organics are dried over $MgSO_4$, filtered and the solvent removed in vacuo to yield the maleimide.

Example 7

Preparation of Dimer Divinyl Ether Derived From Pripol 2033

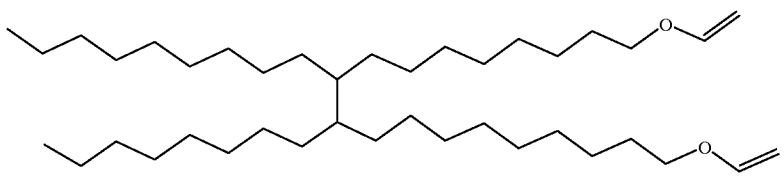

"Dimer Divinyl Ether" (and Cyclic Isomers)

Bis(1,10-phenanthroline)Pd(OAc)$_2$ (0.21 g, 0.54 mmol) was dissolved in a mixture of butyl vinyl ether (8.18 g, 81.7 mmols), heptane (100 mL) and "dimer diol" (sold as Pripol 2033 by Unichema, 15.4 g, 27.2 mmol) in 2 L three-necked flask equipped with a mechanical stirrer under nitrogen. This solution was heated to light reflux for 6 h. The solution was allowed to cool to room temperature and subsequently poured onto activated carbon (20 g) and stirred for 1 hour. The resulting slurry was filtered, and excess butyl vinyl ether and heptane were removed in vacuo to yield the divinyl ether as a yellow oil. The product exhibited acceptable $^1H$ NMR, FT-IR and $^{13}C$ NMR spectral characteristics. Typical viscosity ~100 cPs.

Example 8

Preparation of Dimer Diacrylate Derived from Dimer Diol (Pripol 2033)

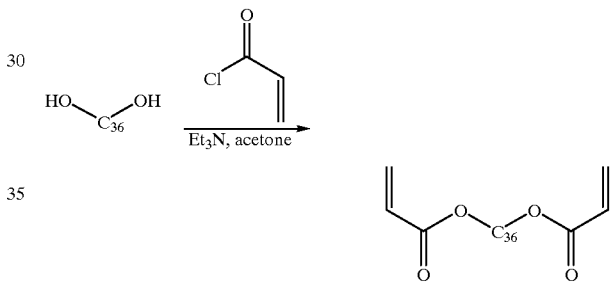

A dimer diol (sold as Pripol 2033 by Unichema, 284.4 g, 500 mmol) is dissolved in dry acetone (500 mL) in a 1 L three-necked flask equipped with mechanical stirrer, addition funnel and internal temperature probe under nitrogen. Triethylamine (101.2 g, 1 mol) is added to this solution and the solution cooled to 4° C. on an ice bath. Acryloyl chloride (90.5 g, 1 mol) solvated in dry acetone (100 mL) is charged into the addition funnel and added to the stirred reaction solution over the course of 60 minutes, maintaining an internal temperature <10° C. This solution is stirred on ice for an additional 2 hours, then allowed to warm to room temperature and stirred for 4 hours. Bulk solvent is removed via a rotary evaporator, and the remaining residue solvated in $CH_2Cl_2$ (1 L). This solution is washed with 5% $HCl_{aq}$ (800 mL), and $H_2O$ (2×800 mL). The isolated organics are dried over MgSO$_4$ anhyd. and filtered, and the solvent removed in vacuo to yield the diacrylate as an oil.

Example 9

Preparation of N-ethylphenyl Maleimide

4-Ethyl aniline (12.12 g) was dissolved in 50 ml of anhydrous ethyl ether and slowly added to a stirred solution of 9.81 g of maleic anhydride in 100 ml of anhydrous ethyl ether chilled in an ice bath. After completion of the addition, the reaction mixture was stirred for 30 minutes. The light yellow crystals were filtered and dried. Acetic anhydride (200 ml) was used to dissolve the maleamic acid and 20 g of sodium acetate. The reaction mixture was heated in an oil bath at 160° C. After 3 hours of reflux, the solution was cooled to room temperature, placed in a 1 L beaker in ice water and stirred vigorously for 1 hour. The product was suction-filtered and recrystallized in hexane. The collected crystalline material was dried at 50° C. in a vacuum oven overnight. FTIR and NMR analysis showed the characteristics of ethyl maleimide.

Example 10

Preparation of Bis(alkenylsulfide)

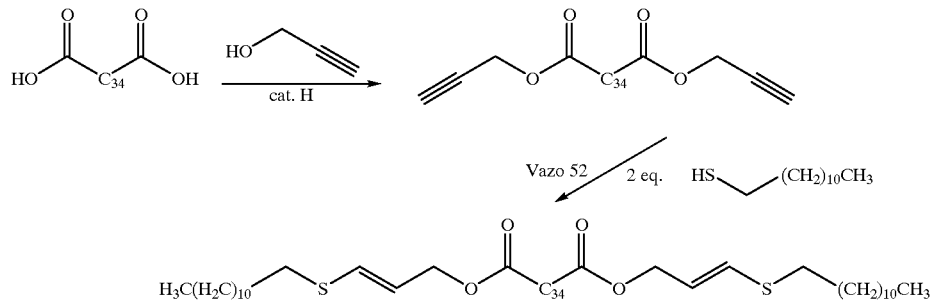

Dimer acid (sold under the trademark Empol 1024 by Unichema) (574.6 g, 1 mol) and propargyl alcohol (112.1 g, 2 mol) are solvated in toluene (1 L) in a 3 L three-necked flask equipped with mechanical stirring and a Dean-Stark distillation apparatus. Concentrated H$_2$SO$_4$ (6 mL) is added and the solution refluxed for 6 hours until 36 mL of H$_2$O is azeotropically distilled. The solution is allowed to cool to room temperature, is washed with H$_2$O (2×1 L), dried over MgSO$_4$ anhyd. and the solvent removed in vacuo to yield the propargyl ester intermediate as an oil.

This ester intermediate (650.7 g, 1 mol) is solvated in THF (200 mL) in a 1 L three-necked flask equipped with reflux condenser, mechanical stirrer and internal temperature probe under nitrogen. Lauryl mercaptan (404.8 g, 2 mol) and 2,2'-azobis(2,4-dimethylpentanenitrile) (sold under the trademark Vazo 52 by DuPont) (11 g) are added and the resulting mixture heated to 70° C. on an oil bath with stirring for 7 hours. The reaction is allowed to cool to room temperature and solvent removed in vacuo to yield the alkenyl sulfide as an oil.

Example 11

Package Encapsulant Compositions

Package encapsulant compositions were prepared by mixing together the organic components and then by blending the components with a silica filler in a weight percent ratio of 17% organic to 83% silica under high shear until homogeneous. The silica was FB-6S silica from Denka. The resulting compositions were light yellow slurries. The organic components, silica ratio by weight, glass transition temperature (Tg), and coefficient of thermal expansion (CTE) are reported here:

| Composition | Sample 11-A | Sample 11-B | Sample 11-C | Sample 11-D |
|---|---|---|---|---|
| Maleimide | N-4-butyl-phenyl maleimide 22.9 g 51.9 wt % | N-4-ethyl-phenyl maleimide 20.1 g 48.7 wt % | Dimer diamine bismaleimide 1.0 g 82.0 wt % | Bismaleimide* 1.0 g 82.0 wt % |
| Vinyl-t-butyl-benzoate | 20.4 g 46.2 wt % | 20.4 g 49.4 wt % | 0.2 g 16.4 wt % | 0.2 g 16.4 wt % |
| Dicumyl peroxide | 0.45 g 1.0 wt % | 0.40 g 1.0 wt % | 0.01 g 0.8 wt % | 0.01 g 0.8 wt % |

-continued

| Composition | Sample 11-A | Sample 11-B | Sample 11-C | Sample 11-D |
|---|---|---|---|---|
| Methacyloxy trimethoxy-silan | 0.40 g 0.9 wt % | 0.40 g 1.0 wt % | 0.01 g 0.8 wt % | 0.01 g 0.8 wt % |
| Tg | 140° C. | 145° C. | 42° C. | 37° C. |
| CTE | 16 ppm/° C. | 15 ppm/° C. | 16 ppm/° C. | 15 ppm/° C. |

*(prepared from polytetramethylene oxide-di-p-aminobenzoate, sold as Versalink P-650 by Henkel)

Example 12

Reworkability

Each composition 11-A to 11-D was tested for reworkability using as a test vehicle a 250×250 mil$^2$ silicon die bonded with the composition to a FR-4 circuit board substrate. The encapsulant composition was dispensed onto the chip adhered to the substrate and the assembly cured at 160° C. for 30 minutes. After the assembly again reached room temperature, a sponge was saturated with methyl isobutyl ketone and used to wipe the encapsulant in a continuous, circular motion. The encapsulant was gradually softened, and it dissolved within 10 minutes sufficiently to leave no residue on the substrate.

This Example demonstrates that these compositions can be made to be reworkable.

Example 13

UV and Thermally Curable Compositions
Composition 13-A

A package encapsulant composition was prepared by combining the following ingredients with vigorous manual mixing until a homogenous paste was obtained:

Bismaleimide (prepared from polytetramethylene oxide-di-p-aminobenzoate,
sold as Versalink P-650 by Henkel) 1.01 g Cyclohexanedimethanol divinylether (International Specialty Products): 0.19 g α,α-Dimethoxy-α-phenylacetophenone (sold as Irgacure 651 by Ciba Specialty Chemicals) 0.06 g Hydrophilic Fused Silica (sold by Denka, ~5 micron) 3.78 g A 250 mil×250 mil silicon die placed on FR-4 laminate was encapsulated with the above paste and irradiated for 30 seconds using a pulsed xenon UV source (RC-500B Pulsed UV Curing System, Xenon Corporation). The encapsulant exhibited a hard, fully cured surface and held the die firmly to the laminate material when force was applied. The sample assembly was subsequently placed in a 175° C. oven for 20 minutes. The encapsulated die was allowed to cool to room temperature and then forcibly removed from the laminate. No regions of uncured encapsulant were detected around the die edge, the laminate/adhesive interface or the adhesive/air surface interface.
Composition 13-B A package encapsulant composition was prepared by combining the following ingredients with vigorous manual mixing until a homogenous paste was obtained:

Bismaleimide (prepared from polytetramethylene oxide-di-p-aminobenzoate,
sold as Versalink P-650 by Henkel) 1.01 g Cyclohexanedimethanol divinylether (International Specialty Products): 0.19 g t-Butyl-2-ethylhexanoate 0.03 g
Hydrophilic Fused Silica
(sold by Denka, ~5 micron) 3.78 g A 250 mil×250 mil silicon die placed on FR-4 laminate was encapsulated with the above paste and placed in a 150° C. oven for 30 min. The test assembly was allowed to cool to room temperature and the die was forcibly removed from the laminate. No regions of uncured encapsulant were detected around the die edge, the laminate/adhesive interface or the adhesive/air surface interface.

Example A

Preparation of 6-maleimidocaproic acid

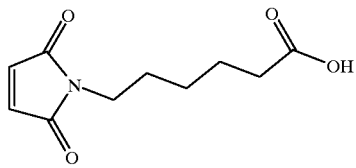

6-maleimidocaproic acid

The acid functional maleimide, 6-maleimidocaproic acid, was synthesized using known methodology.[1] Aminocaproic acid (100 g, $7.6 \times 10^{-1}$ mols) was dissolved in glacial acetic acid (50 mL) in a 500 mL four-necked flask equipped with mechanical stirring, an internal temperature probe and an addition funnel. The addition funnel was charged with a solution of maleic anhydride (74.8 g, $7.6 \times 10^{-1}$ mols) dissolved in acetonitrile (75 mL). This solution was added to the aminocaproic acid at room temperature dropwise over 1 hour, maintaining an internal reaction temperature less than 35° C. The reaction was stirred for three hours after the addition was complete. The reaction slurry was filtered, and the isolated filtrate was dried in a vacuum oven (P-25 T) overnight at 70° C. to yield 166 g of off white solid (95%). The product amic acid exhibited FT-IR and $^1$H NMR spectral characteristics consistent with literature data.

The amic acid described above (166 g, $7.2 \times 10^{-1}$ mols) was solvated in a solution of toluene (200 mL), benzene (200 mL) and triethylamine (211 mL, 1.51 mol) in a 1 L three-necked flask equipped with mechanical stirring and a Dean-Stark trap under nitrogen. This solution was heated to reflux for 4 h and the water produced collected in the Dean-Stark trap. Distilled water (400 mL) was added to the reaction flask to dissolve the triethylammonium salt of the product which largely separated from the bulk solution during the reaction. This aqueous layer was isolated, acidified to pH~1 with 50% HCl, and extracted with ethyl acetate (600 mL). This organic layer was washed with distilled water (400 mL). The isolated organic layer was dried over $MgSO_4$, followed by solvent removal in vacuo to yield an off white solid (76.2 g, 50%). The product 6-maleimidocaproic acid was spectrographically identical to literature material by FT-IR and $^1$H NMR.

Example B

Preparation of "Dimer Diester Bismaleimide"

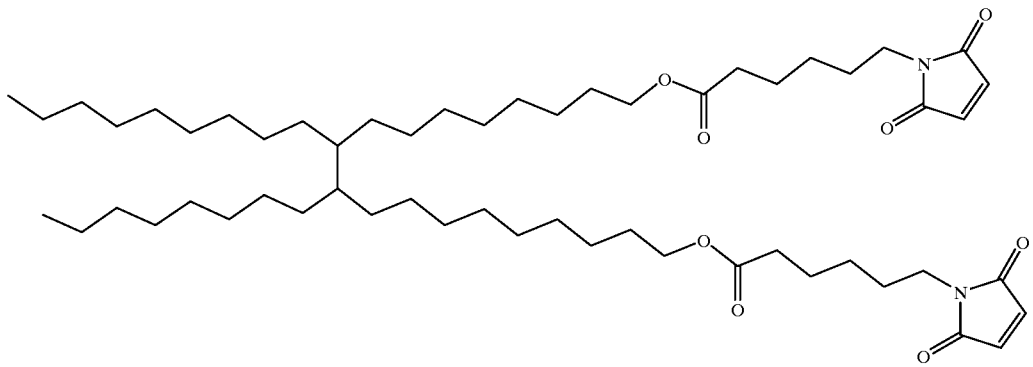

"Dimer Diester Bismaleimide" (and Cyclic Isomers)

Pripol 2033 ("dimer diol", Uniqema, 92.4 g, $1.69 \times 10^{-1}$ mols), 6-maleimidocaproic acid (75.0 g, $3.55 \times 10^{-1}$ mols) and $H_2SO_4$ (0.50 mL, $\sim 8.5 \times 10^{-3}$ mols) were slurried in toluene (300 mL) in a 1 L four-necked flask equipped with mechanical stirrer, a Dean-Stark trap and an internal temperature probe under nitrogen. The reaction was heated to light reflux for two hours and the water evolved collected in the Dean-Stark trap. The trap was drained and ~50 mL of toluene solvent was distilled off of the reaction to remove trace moisture and drive the esterification equilibrium to completion. The reaction was allowed to cool to room temperature, additional toluene (100 mL) was added (on the laboratory scale it is preferable to add diethyl ether in place of toluene at this point), and the solution was washed with saturated $NaHCO_3$ aq. (300 mL) and distilled water (300 mL). The organic layer was isolated and dried over anhydrous $MgSO_4$, and the solvent removed in vacuo to yield an orange oil (107.2 g, 68%). The material can be further purified by eluting a toluene solution of the resin through a short plug of silica or alumina. This liquid bismaleimide resin exhibited acceptable FT-IR, $^1H$ NMR, and $^{13}C$ NMR data. Typical $\eta \sim 2500$ cPs.

Example C

Preparation of "Decane Diol Diester Bismaleimde"

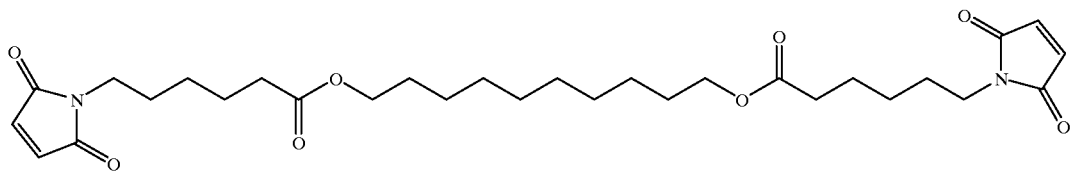

Decane Diol Diester Bismaleimide

The general procedure described in Example B. was applied substituting decane diol (29.5 g, $1.69 \times 10^{-1}$ mols) for Pripol 2033. This process yielded a solid, moderately soluble bismaleimide (54.9 g, 58%). The product exhibited satisfactory FT-IR and $^1H$ NMR data.

Example D

Preparation of "Glycerol Triester Tris(maleimide)"

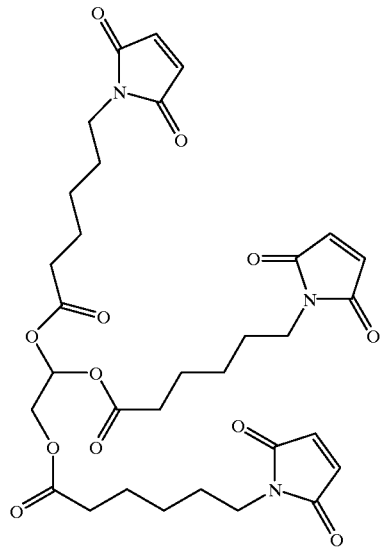

The protocol outlined in example B. was utilized substituting glycerol (10.4 g, $1.13 \times 10^{-1}$ mol) for Pripol 2033. The product was a viscous liquid which exhibited acceptable FT-IR and $^1$H NMR data.

Example E

Preparation of "Bis(m-nitrobenzyl carbamate) of IPDI"

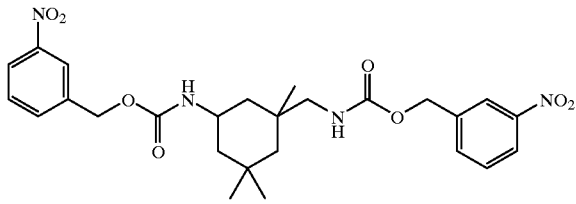

Bis(m-nitrobenzyl carbamate) of IPDI

Isophorone diisocyanate ("IPDI", 100.0 g, $4.5 \times 10^{-1}$ mols), m-nitrobenzyl alcohol (137.8 g, $9.0 \times 10^{-1}$ mols) and dibutyl tin dilaurate (2.8 g, $4.5 \times 10^{-3}$ mols) were solvated in dry toluene (1500 mL) in a 2L three-necked flask equipped with mechanical stirrer, reflux condenser and internal temperature probe under nitrogen. The resulting solution was heated to 90° C. for 4 h. No isocyanate band was observed in the IR of the solids portion of the sample. The solution was allowed to cool to room temperature and washed with distilled $H_2O$ (100 mL). The organic layer was isolated and solvent removed in vacuo to yield a yellow liquid which exhibited acceptable FT-IR and $^1$H NMR characteristics.

Example F

Preparation of "Bis(m-aminobenzyl carbamate) of IPDI"

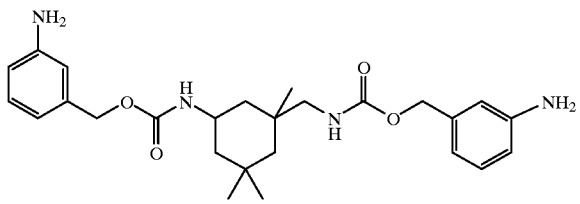

Bis(m-aminobenzyl carbamate) of IPDI

The dinitro compound from Example E. (8.28 g, $1.57 \times 10^{-2}$ mols) was dissolved in ethanol (100 mL) in a 500 mL three-necked round bottom flask equipped with magnetic stirring under nitrogen. Cyclohexene (28.6 mL, $2.82 \times 10^{-1}$ mols) was added, followed by 5% Pd/C (4.14 g). The resulting slurry was refluxed lightly for 6.5 h. The FT-IR of a filtered aliquot of this solution exhibited no nitro stretching bands at 1529 $cm^{-1}$ and 1352 $cm^{-1}$. The bulk solution was allowed to cool to room temperature and filtered. Solvent was removed in vacuo to yield a yellow semisolid (6.6 g, 90%) which exhibited acceptable FT-IR and $^1$H NMR spectral characteristics.

Example G

Preparation of "Bis(m-maleimidobenzyl carbamate) of IPDI"

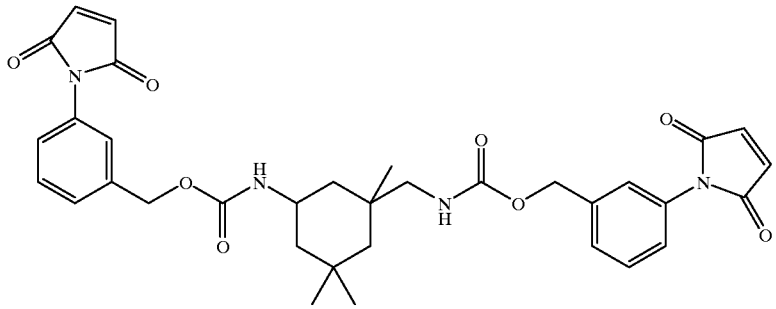

Bis(m-maleimidobenzyl carbamate) of IPDI

The diamine from Example F (6.6 g, $1.41 \times 1^{-2}$ mols) was solvated in acetone (60 mL) in a 250 mL four-necked flask equipped with magnetic stirrer and addition funnel under nitrogen and cooled to 4° C. Maleic anhydride (2.76 g, $2.82 \times 10^{-2}$ mols) dissloved in acetone (20 mL) was added over the course of 30 minutes. The resulting solution was stirred at 4° C. for for 1 h, and subsequently was allowed to warm to room temperature and stirred overnight. FT-IR analysis indicated no maleic anhydride remained as judged by the absence of the anhydride stretching band at ~1810 $cm^{-1}$.

To the above amic acid solution was added acetic anhydride (8.5 mL, $9.0 \times 10^{-2}$ mols), triethylamine (1.26 mL, $9.0 \times 10^{-3}$ mols) and sodium acetate (0.88 g, $1.1 \times 10^{-2}$ mols). The resulting solution was refluxed lightly for 4 h under nitrogen. The reaction was allowed to cool to room temperature and bulk solvent was removed in vacuo. The resulting viscous liquid was resolvated in methylene chloride (200 mL) and extracted with distilled water (3×200 mL). The organics were then dried over MgSO$_4$ anhyd., filtered and solvent removed in vacuo to yield a light brown solid (6.75 g, 76%). This material exhibited acceptable FT-IR and $^1$H NMR spectral features.

Example H

Preparation of "Bis(m-nitrobenzyl carbamate) of DDI 1410"

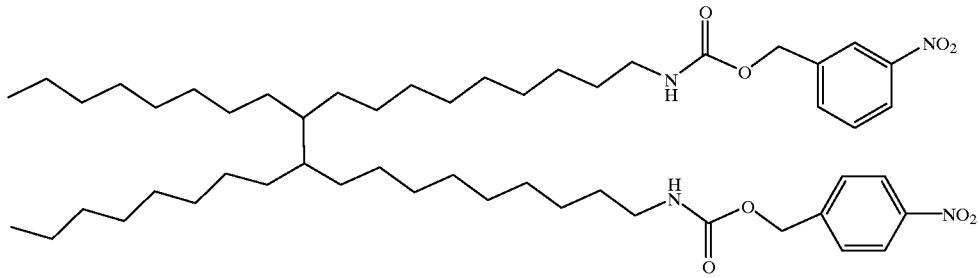

"Bis(m-nitrobenzyl carbamate) of DDI 1410" (and cyclic isomers)

DDI 1410 (Henkel, "Dimer Diisocyanate", 99.77 g, 1.65× $10^{-1}$ mols based on 13.96% NCO), m-nitrobenzyl alcohol (50.8 g, 3.32×$10^{-1}$ mols) and dibutyltin dilaurate (0.5 mL, 8.3×$10^{-4}$ mols) were solvated in toluene (150 mL) in a 1 L four-necked flask equipped with mechanical stirrer, reflux condensor and internal temperature probe under nitrogen. The reaction was heated to 85° C. for 2.5 h. FT-IR analysis of an aliquot of the reaction indicated complete comsumption of isocyanate functionality as judged by the lack of a band at 2272 cm$^{-1}$. Solvent was removed from the reaction in vacuo to yield a yellow oil which solidified upon standing at room temperature (152.4 g, 102% (trace toluene)). This solid exhibited satisfactory FT-IR and $^1$H NMR spectral features.

Example I

Preparation of "Bis(m-aminobenzyl carbamate) of DDI 1410"

"Bis(m-aminobenzyl carbamate) of DDI 1410" (and cyclic isomers)

The diamine product of Example H (39.6 g, 4.32×$10^{-2}$ mols) and stannous chloride dihydrate (97.55 g, 4.32×$10^{-1}$ mols) were slurried in ethyl acetate (300 mL) in a 1 L three-necked flask equipped with mechanical stirrer and a reflux condenser under nitrogen. The reaction was heated to light reflux and stirred vigorously for 3 h. The solution was allowed to cool to room temperature and brought to pH 7–8 with a solution of saturated sodium bicarbonate. The mixture was pushed through a 25 micron filter to yield a mixture which separated into a cloudy aqueous layer and a moderately clear organic layer. The aqueous layer was isolated and washed with ethyl acetate (100 mL). The organic layers were combined, washed with distilled water (300 mL) and dried over anhydrous MgSO$_4$. The slurry was filtered and solvent removed from the filtrate in vacuo to yield yellow, sticky solid (33.8 g, 92%).

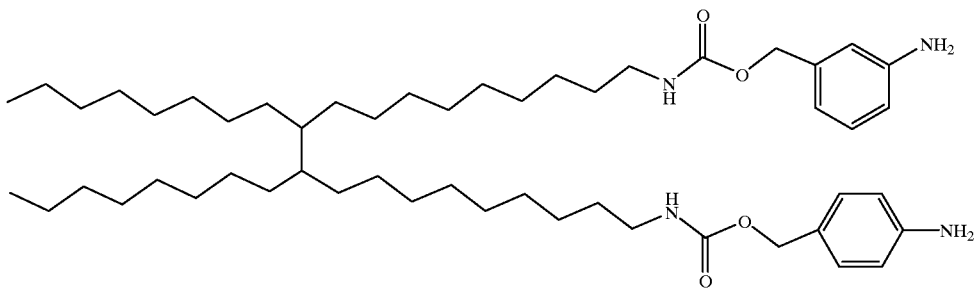

Example J

Preparation of "Bis(m-maleimidobenzyl carbamate) of DDI 1410"

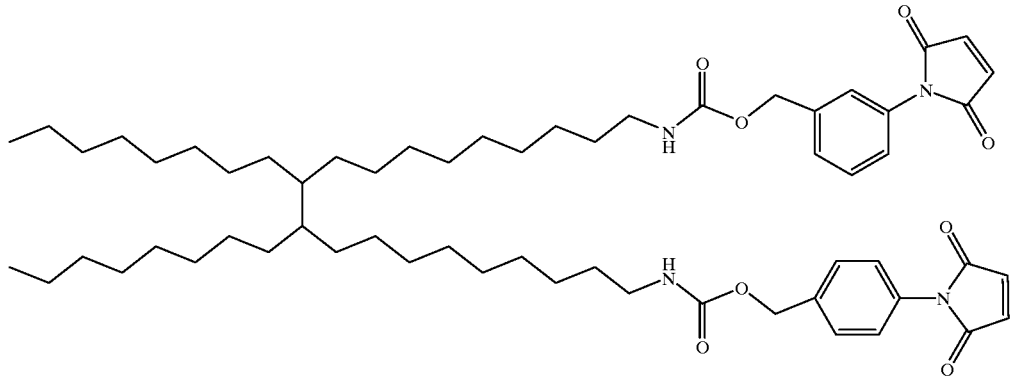

"Bis(m-maleimidobenzyl carbamate) of DDI 1410"
(and cyclic isomers)

Maleic anhydride (15.4 g, 1.57×10$^{-2}$ mols) was dissolved in acetone g (300 mL) in a 2 L four-necked flask equipped with mechanical stirrer, internal temperature probe and addition funnel under nitrogen. This solution was cooled to ~4° C. on an ice bath. A solution of the diamine prepared in Example I (63.4 g, 7.48×10$^{-2}$ mols) in acetone (70 mL) was charged to the addition funnel and added to the maleic anhydride solution over a period of 30 minutes maintaining an internal temperature of <10° C. The resulting solution was stirred for 1 h and subsequently allowed to warm to room temperature and stir for 2 h.

To this solution of amic acid was added acetic anhydride (24.7 mL, 2.62×10$^{-1}$ mols), triethylamine (6.25 mL, 4.48× 10$^{-2}$ mols) and manganese acetate tetrahydrate (0.37 g, 1.50×10$^{-3}$ mols). This solution was heated to light reflux for 6.5 h, then allowed to cool to room temperature. Bulk solvent was removed in vacuo, and the resulting dark liquid was dissolved in diethyl ether (500 mL). This solution was washed with dist. H$_2$O (500 mL). The isolated organic layer was then washed with saturated NaHCO$_3$ aq. (500 mL) and again with dist. H$_2$O (500 mL). The organics were isolated, dried over anhyd. MgSO$_4$, and solvent removed in vacuo to yield a viscous orange oil. This material exhibited FT-IR, $^1$H NMR and $^{13}$C NMR spectral features consistent with the expected bismaleimide product.

What is claimed is:

1. A curable package encapsulant composition comprising a maleimide compound, and a curing initiator selected from the group consisting of a free-radical initiator, a photoinitiator, and a combination of those, the maleimide compound having the formula:

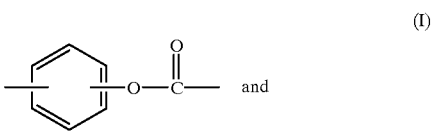

in which n is 1 to 6 and (a) R$^1$ is H or an alkyl group having 1 to 5 carbon atoms;
(b) Ar is an aromatic group selected from the aromatic groups having the structures:

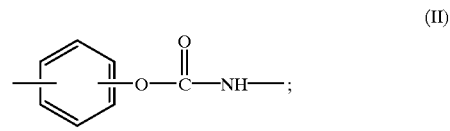

(c) Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

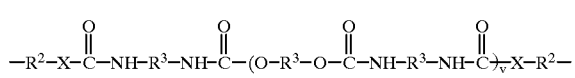

in which each R$^2$ independently is an alkyl, aryl, or arylalkyl group having 1 to 18 carbon atoms; R$^3$ is an alkyl or alkyloxy chain having up to 100 atoms in the chain, which chain may contain aryl substituents; X is O, S, N, or P; and v is 0 to 50; or Q is an ester having the structure:

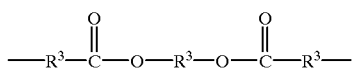

in which $R^3$ is an alkyl or alkyloxy chain having up to 100 atoms in the chain, which chain may contain aryl substituents; or Q is a siloxane having the structure: $-(CR^1{}_2)_e-(SiR^4{}_2-O)_f-SiR^4{}_2-(CR^1{}_2)_g-$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

2. The curable package encapsulant composition according to claim 1 in which Q is the urethane.

3. A curable package encapsulant composition comprising a maleimide compound, and a curing initiator selected from the group consisting of a free-radical initiator, a photoinitiator, and a combination of those, the maleimide compound having the formula:

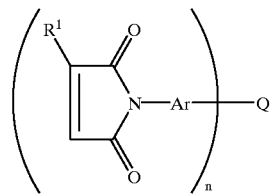

in which n is 1 to 6 and (a) $R^1$ is H or an alkyl group having 1 to 5 carbon atoms;
(b) Ar is an aromatic group selected from the aromatic groups having the structures:

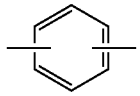
(III)

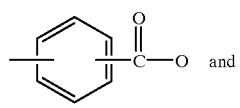
(IV)

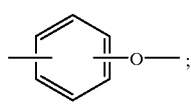
(V)

(c) Q is a linear or branched chain alkyl amine, alkyl sulfide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

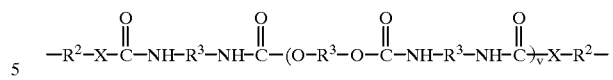

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

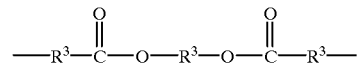

in which $R^3$ is an alkyl or alkyloxy chain having up to 100 atoms in the chain, which chain may contain aryl substituents.

4. The curable package encapsulant composition according to claim 3 in which Q is the urethane.

5. The curable package encapsulant composition according to claim 3 in which Q is the ester.

6. A curable package encapsulant composition comprising a maleimide compound and a curing initiator selected from the group consisting of a free-radical initiator, a photoinitiator, and a combination of those, the maleimide compound having the formula

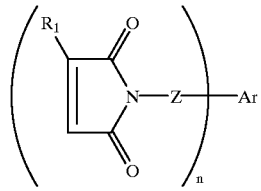

in which n is 1 to 6, and (a) $R^1$ is H or an alkyl having 1 to 5 carbon atoms;
(b) Z is a linear or branched chain alkyl amine, alkyl sulfide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Z is a urethane having the structure:

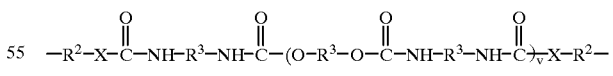

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Z is a siloxane having the structure: $-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10, and f is 1 to 50; or Z is an ester having the structure:

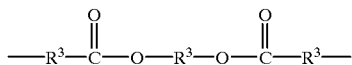

in which $R^3$ is an alkyl or alkyloxy chain having up to 100 atoms in the chain, which chain may contain aryl substituents;

(c) Ar is an aromatic group selected from group of aromatic groups having the structures:

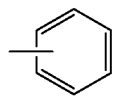
(VI)

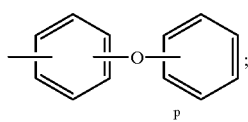
(VII)

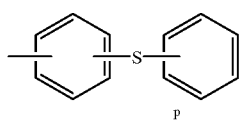
(VIII)

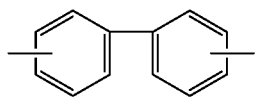
(IX)

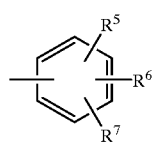
(X)

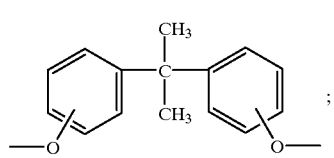
(XI)

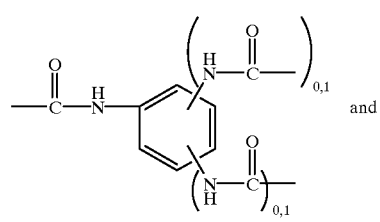
(XII)

and

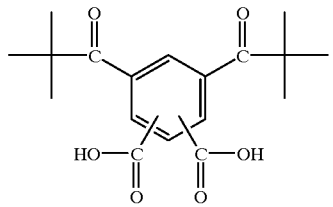
(XIII)

in which p is 1 to 100;

$R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or $R^5$, $R^6$, and $R^7$ are a siloxane having the structure $-(CR^1{}_2)_e-[SiR^4{}_2-O]_f-R^4{}_2-(CH_3)_g-$ in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 0 to 50.

7. The curable package encapsulant composition according to claim 6 in which Z is the urethane.

8. The curable package encapsulant composition according to claim 6 in which Z is the siloxane.

9. The curable package encapsulant composition according to claim 6 in which Z is the ester.

10. A curable package encapsulant composition comprising a maleimide compound and a curing initiator selected from the group consisting of a free-radical initiator, a photoinitiator, and a combination of those, the maleimide compound having the formula

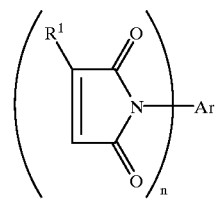

which n is 1 to 6, and (a) $R^1$ is H or an alkyl having 1 to 5 carbon atoms;

(b) Ar is an aromatic group selected from group of aromatic groups having the structures:

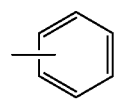
(VI)

-continued

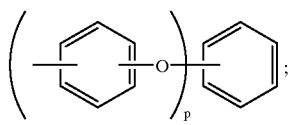 (VII)

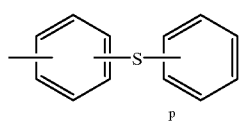 (VIII)

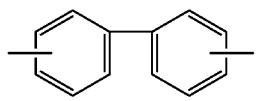 (IX)

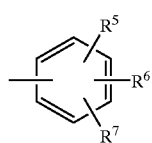 (X)

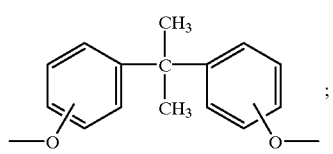 (XI)

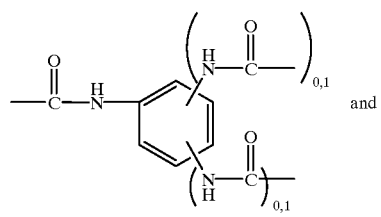 (XII)

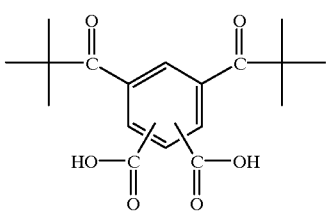 (XIII)

in which p is 1 to 100;

$R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or $R^5$, $R^6$, and $R^7$ are a siloxane having the structure —$(CR^1_2)_e$—$[SiR^4_2$—$O]_f$—$R^4_2$—$(CH_3)_g$— in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 0 to 50.

11. A curable package encapsulant composition comprising a vinyl compound, and a curing initiator selected from the group consisting of a free-radical initiator, a photoinitiator, and a combination of those, the vinyl compound having the formula

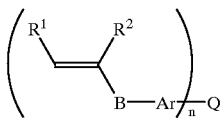

in which n is 1 to 6, and
(a) $R^1$ and $R^2$ are H or an alkyl group having 1 to 5 carbon atoms, or together form a 5 to 9 membered ring with the carbons forming the vinyl group;
(b) B is C, S, N, O, C(O), O—C(O), C(O)—O, C(O)NH or C(O)N($R^8$), in which $R^8$ is an alkyl group having 1 to 5 carbon atoms;
(c) each Ar is an aromatic group selected from the group of aromatic groups having the structures:

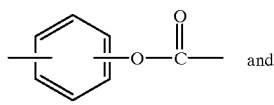 (I)

and

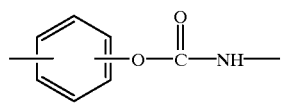 (II)

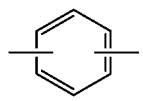 (III)

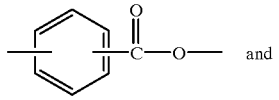 (IV)

and

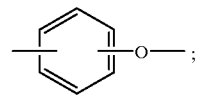 (V)

(d) Q is a linear or branched chain alkyl amine, alkyl sulfide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

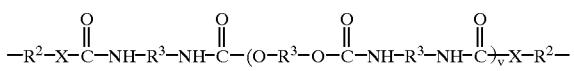

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

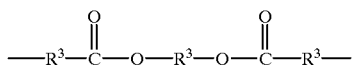

in which R³ is an alkyl or alkyloxy chain having up to 100 atoms in the chain, which chain may contain aryl substituents; or Q is a siloxane having the structure: —(CR¹$_2$)$_e$—(SiR⁴$_2$—O)$_f$—SiR⁴$_2$—(CR¹$_2$)$_g$— in which the R¹ substituent independently for each position is H or an alkyl group having 1 to 5 carbon atoms, and the R⁴ substituent independently for each position is an alkyl group having 1 to 5 carbon atoms or an aryl group, and e and g are independently 1 to 10 and f is 1 to 50.

12. The curable package encapsulant composition according to claim 11 in which Q is the urethane.

13. The curable package encapsulant composition according to claim 11 in which Q is the ester.

14. The curable package encapsulant composition according to claim 11 in which Q is the siloxane.

15. A curable package encapsulant composition comprising a vinyl compound, and a curing initiator selected from the group consisting of a free-radical initiator, a photoinitiator, and a combination of those, the vinyl compound having the formula

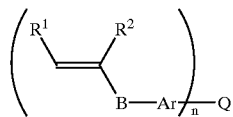

in which n is 1 to 6, and (a) R¹ and R² are H or an alkyl group having 1 to 5 carbon atoms, or together form a 5 to 9 membered ring with the carbons forming the vinyl group;

(b) B is C, S, N, C(O)NH or C(O)N(R⁸), in which R⁸ is an alkyl group having 1 to 5 carbon atoms;

(c) Ar is an aromatic group selected from the aromatic groups having the structures:

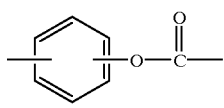
(I)

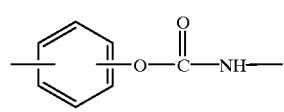
(II)

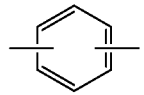
(III)

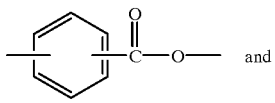
(IV)

and

-continued

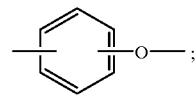
(V)

(d) Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

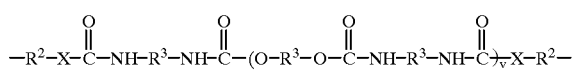

in which each R² independently is an alkyl, aryl, or arylalkyl group having 1 to 18 carbon atoms; R³ is an alkyl or alkyloxy chain having up to 100 atoms in the chain, which chain may contain aryl substituents; X is O, S, N, or P; and v is 0 to 50; or Q is an ester having the structure:

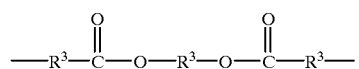

in which R³ is an alkyl or alkyloxy chain having up to 100 atoms in the chain, which chain may contain aryl substituents; or Q is a siloxane having the structure: —(CR¹$_2$)$_e$—(SiR⁴$_2$—O)$_f$—SiR⁴$_2$—(CR¹$_2$)$_g$— in which the R¹ substituent independently for each position is H or an alkyl group having 1 to 5 carbon atoms, and the R⁴ substituent independently for each position is an alkyl group having 1 to 5 carbon atoms or an aryl group, and e and g are independently 1 to 10 and f is 1 to 50.

16. The curable package encapsulant composition according to claim 15 in which Q is the urethane.

17. The curable package encapsulant composition according to claim 15 in which Q is the ester.

18. The curable package encapsulant composition according to claim 15 in which Q is the siloxane.

19. A curable package encapsulant composition comprising a vinyl compound, and a curing initiator selected from the group consisting of a free-radical initiator, a photoinitiator, and a combination of those, the vinyl compound having the formula

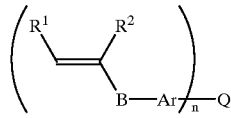

in which n is 1 to 6, and (a) R¹ and R² are H or an alkyl group having 1 to 5 carbon atoms, or together form a 5 to 9 membered ring with the carbons forming the vinyl group;

(b) B is C, S, N, O, C(O), O—C(O), C(O)—O, C(O)NH or C(O)N($R^8$), in which $R^8$ is an alkyl group having 1 to 5 carbon atoms;

(c) Ar is an aromatic group selected from the aromatic groups having the structures:

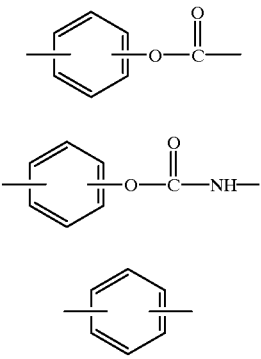

I

II

III (d) Q is a linear or branched chain alkyl, alkyloxy, alkyl amine, alkyl sulfide, alkylene, alkylene oxide, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

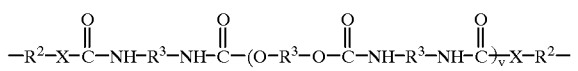

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

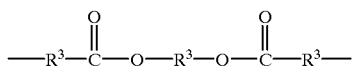

in which $R^3$ is an alkyl or alkyloxy chain having up to 100 atoms in the chain, which chain may contain aryl substituents; or Q is a siloxane having the structure: —$(CR^1{}_2)_e$—$(SiR^4{}_2$—O$)_f$—$SiR^4{}_2$—$(CR^1{}_2)_g$— in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

20. The curable package encapsulant composition according to claim 19 in which Q is the urethane.

21. The curable package encapsulant composition according to claim 19 in which Q is the ester.

22. The curable package encapsulant composition according to claim 19 in which Q is the siloxane.

23. A curable package encapsulant composition comprising a vinyl compound, and a curing initiator selected from the group consisting of a free-radical initiator, a photoinitiator, and a combination of those, the vinyl compound having the formula

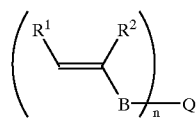

in which n is 1 to 6, and (a) $R^1$ and $R^2$ are H or an alkyl group having 1 to 5 carbon atoms, or together form a 5 to 9 membered ring with the carbons forming the vinyl group;

(b) B is C, S, N, O, C(O), O—C(O), C(O)—O, C(O)NH or C(O)N($R^8$), in which $R^8$ is an alkyl group having 1 to 5 carbon atoms;

(c) Q is a urethane having the structure:

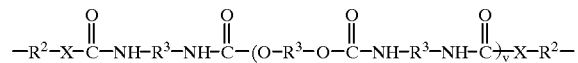

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50.

24. A curable package encapsulant composition comprising a vinyl compound, and a curing initiator selected from the group consisting of a free-radical initiator, a photoinitiator, and a combination of those, the vinyl compound having the formula

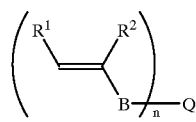

in which n is 1 to 6, and (a) $R^1$ and $R^2$ are H or an alkyl group having 1 to 5 carbon atoms, or together form a 5 to 9 membered ring with the carbons forming the vinyl group;

(b) B is C, S, N, C(O)NH or C(O)N($R^8$), in which $R^8$ is an alkyl group having 1 to 5 carbon atoms;

(c) Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to Ar; or Q is a urethane having the structure:

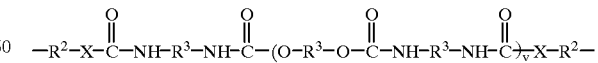

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and v is 0 to 50; or Q is an ester having the structure:

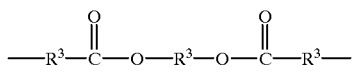

in which $R^3$ is an alkyl or alkyloxy chain having up to 100 atoms in the chain, which chain may contain aryl substituents; or Q is a siloxane having the structure: $-(CR^1_2)_e-(SiR^4_2-O)_f-SiR^4_2-(CR^1_2)_g-$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50.

25. The curable package encapsulant composition according to claim 24 in which Q is the urethane.

26. The curable package encapsulant composition according to claim 24 in which Q is the ester.

27. The curable package encapsulant composition according to claim 24 in which Q is the siloxane.

* * * * *